US012610632B2

(12) United States Patent
Zeng et al.

(10) Patent No.: US 12,610,632 B2
(45) Date of Patent: Apr. 21, 2026

(54) SEMICONDUCTOR DEVICE AND MANUFACTURING METHOD THEREFOR, AND CHIP BONDING STRUCTURE

(71) Applicant: WUHAN XINXIN SEMICONDUCTOR MANUFACTURING CO., LTD., Wuhan (CN)

(72) Inventors: Tian Zeng, Wuhan (CN); Di Zhan, Wuhan (CN); Tianjian Liu, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 412 days.

(21) Appl. No.: 18/250,633

(22) PCT Filed: Dec. 15, 2020

(86) PCT No.: PCT/CN2020/136623
§ 371 (c)(1),
(2) Date: Apr. 26, 2023

(87) PCT Pub. No.: WO2022/110348
PCT Pub. Date: Jun. 2, 2022

(65) Prior Publication Data
US 2023/0411435 A1 Dec. 21, 2023

(30) Foreign Application Priority Data
Nov. 30, 2020 (CN) .......................... 202011378733.0

(51) Int. Cl.
*H01L 21/48* (2006.01)
*H01L 21/768* (2006.01)
*H10F 39/00* (2025.01)

(52) U.S. Cl.
CPC ......... *H10F 39/026* (2025.01); *H01L 21/486* (2013.01); *H01L 21/76898* (2013.01);
(Continued)

(58) Field of Classification Search
CPC ........................ H01L 21/486; H01L 21/76898
See application file for complete search history.

(56) References Cited

U.S. PATENT DOCUMENTS 6,403,466 B1 6/2002 Lopatin
2003/0039897 A1 2/2003 Morita
(Continued)

FOREIGN PATENT DOCUMENTS

CN 102437104 A 5/2012
CN 102543858 A 7/2012
(Continued)

*Primary Examiner* — David A Zarneke
(74) *Attorney, Agent, or Firm* — Muncy, Geissler, Olds & Lowe, P.C.

(57) ABSTRACT

A method of manufacturing a semiconductor device includes: providing bonded first and second wafers; forming a patterned insulating layer on the second substrate, the patterned insulating layer having first holes and dummy holes both exposing the second substrate; forming a protective layer, which fills a partial depth of the dummy holes and covers side surfaces of the first holes; forming through-silicon vias (TSVs); and forming a second metal layer including an interconnect metal layer and a dummy metal layer, the interconnect metal layer filling the TSVs and electrically connected to the first metal layer, the dummy metal layer filling the dummy holes. The formation of the dummy metal layer is integrated in the TSV process and is therefore done without using any additional process or adding additional cost to enable uniform pattern density (e.g., metal density) across the surface of the second wafer and enhanced CMP uniformity.

10 Claims, 6 Drawing Sheets

(52) U.S. Cl.
    CPC ......... *H10F 39/018* (2025.01); *H10F 39/809*
           (2025.01); *H10F 39/811* (2025.01)

(56)            References Cited

U.S. PATENT DOCUMENTS

| | | |
|---|---|---|
| 2010/0261095 A1 | 10/2010 | Grant et al. |
| 2011/0097896 A1 | 4/2011 | Daamen et al. |

FOREIGN PATENT DOCUMENTS

| | | | |
|---|---|---|---|
| CN | 102779782 A | 11/2012 |
| CN | 109148361 A | 1/2019 |
| KR | 20030092520 A | 12/2003 |

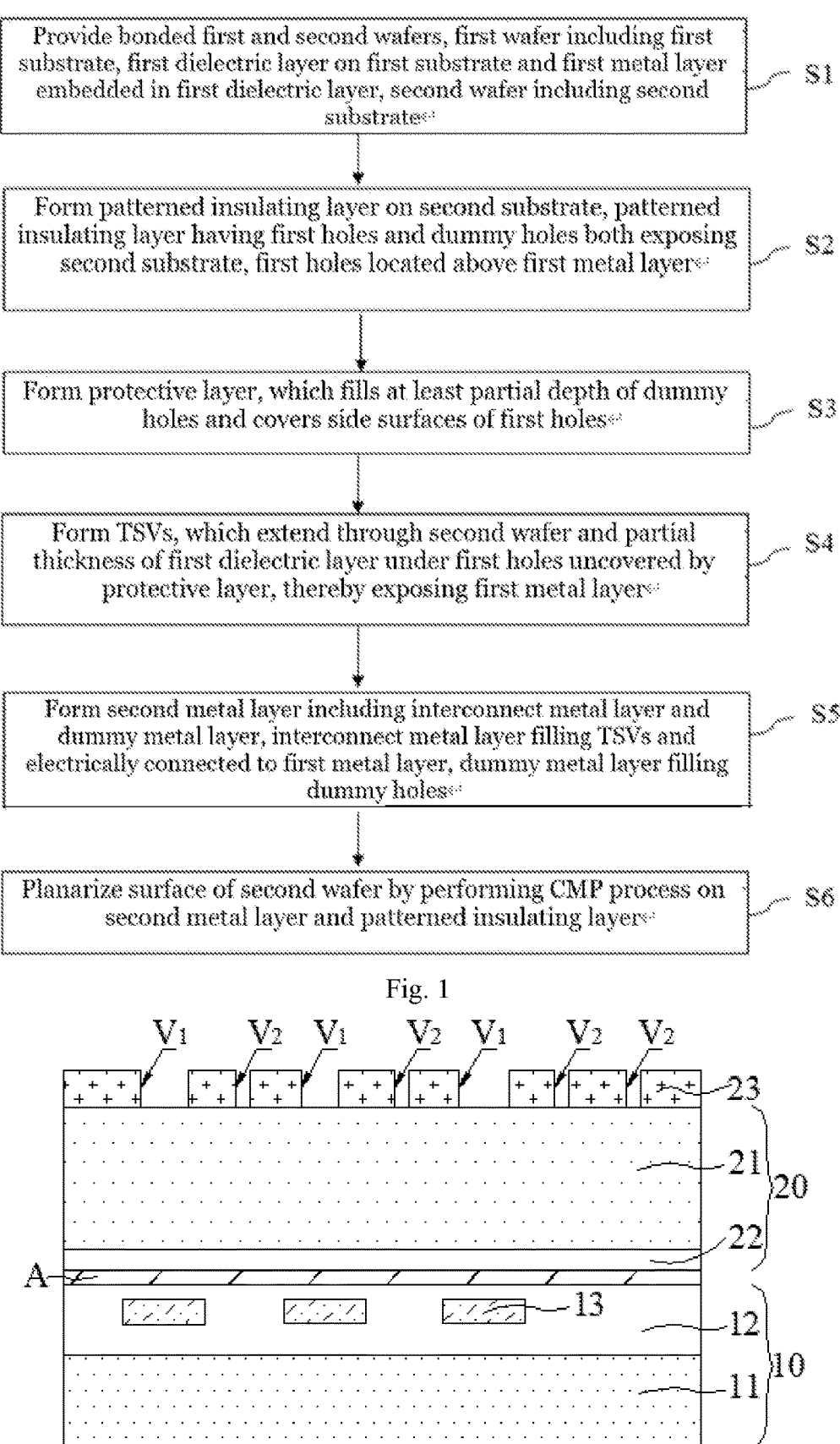

Provide bonded first and second wafers, first wafer including first substrate, first dielectric layer on first substrate and first metal layer embedded in first dielectric layer, second wafer including second substrate — S1

Form patterned insulating layer on second substrate, patterned insulating layer having first holes and dummy holes both exposing second substrate, first holes located above first metal layer — S2

Form protective layer, which fills at least partial depth of dummy holes and covers side surfaces of first holes — S3

Form TSVs, which extend through second wafer and partial thickness of first dielectric layer under first holes uncovered by protective layer, thereby exposing first metal layer — S4

Form second metal layer including interconnect metal layer and dummy metal layer, interconnect metal layer filling TSVs and electrically connected to first metal layer, dummy metal layer filling dummy holes — S5

Planarize surface of second wafer by performing CMP process on second metal layer and patterned insulating layer — S6

SEMICONDUCTOR DEVICE AND MANUFACTURING METHOD THEREFOR, AND CHIP BONDING STRUCTURE

TECHNICAL FIELD

The present invention pertains to the field of integrated circuit (IC) fabrication technology, and particularly relates to a semiconductor device, a method of manufacturing the device and a bonded-chip structure.

BACKGROUND

In semiconductor technology, chemical mechanical polishing (CMP) is considered as an important process for wafer surface planarization in the current very large-scale integration (VLSI). Good wafer morphology with high flatness can impart significantly reduced complexity and improved accuracy, stability and the like to the subsequent processes. CMP typically relies on chemical corrosion of a polishing slurry and abrasion of ultrafine particles to form a smooth and flat surface of a dielectric material being processed. However, the ever-shrinking process geometries have brought great challenges to CMP techniques. In some specially designed patterns, for example, those containing through-silicon vias (TSV) in which metal copper is usually filled, a top wafer surface with the TSVs tends to exhibit a higher metal density, making the wafer surface to be polished have different pattern densities (e.g., different metal densities). When such pattern densities are significantly different, the regions with these pattern densities would show different CMP rates, leading to a post-CMP wafer surface with unsatisfactory flatness.

SUMMARY OF THE INVENTION

It is an objective of the present invention to provide a semiconductor device, a method of manufacturing the device and a bonded-chip structure, which enable increased CMP uniformity and hence higher post-CMP flatness of a wafer surface.

To this end, the present invention provides a method of manufacturing a semiconductor device, which includes:

providing bonded first and second wafers, the first wafer including a first substrate, a first dielectric layer on the first substrate and a first metal layer embedded in the first dielectric layer, the second wafer including a second substrate;

forming a patterned insulating layer on the second substrate, the patterned insulating layer having first holes and dummy holes both exposing the second substrate, the first holes located above the first metal layer;

forming a protective layer, which fills at least a partial depth of the dummy holes and covers side surfaces of the first holes;

forming TSVs, which extend through the second wafer and a partial thickness of the first dielectric layer under the first holes uncovered by the protective layer, thereby exposing the first metal layer;

forming a second metal layer including an interconnect metal layer and a dummy metal layer, the interconnect metal layer filling the TSVs and electrically connected to the first metal layer, the dummy metal layer filling the dummy holes; and planarizing a surface of the second wafer by performing a CMP process on the second metal layer and the patterned insulating layer.

Additionally, the dummy holes may be scattered in regions of the patterned insulating layer without or with sparse first holes, resulting in a uniform overall distribution of the first and dummy holes in the patterned insulating layer.

Additionally, a plurality of first holes may be spaced apart in the patterned insulating layer, wherein the dummy holes are scattered between adjacent first holes.

Additionally, the formation of the protective layer may include:

depositing an initial protective layer, which fills the dummy holes and covers side and bottom surfaces of the first holes and a top surface of the patterned insulating layer; and removing the initial protective layer on the bottom surfaces of the first holes and on the patterned insulating layer and a partial thickness of the initial protective layer in the dummy holes by maskless etching, with the remainder of the initial protective layer forming the protective layer.

Additionally, a cross-sectional width W of the dummy holes in a cross-sectional plane perpendicular to the second substrate and a thickness h of the initial protective layer deposited on the side surfaces of the first holes satisfies $2h \geq W$, making the initial protective layer span the dummy holes in a direction parallel to the second substrate.

Additionally, the formation of the TSVs may include:

forming initial holes, which extend through the second substrate under the first holes;

forming an isolation layer, which covers side and bottom surfaces of the initial holes and side and bottom surfaces of the dummy holes; and etching through the isolation layer, the second dielectric layer in the second wafer and a partial thickness of the first dielectric layer under the initial holes until the first metal layer is exposed, resulting in the formation of the TSVs.

Additionally, in the step of performing the CMP process on the second metal layer and the patterned insulating layer, a partial thickness of the dummy metal layer or the entirety thereof may be removed by the CMP process.

Additionally, the dummy metal layer may serve as alignment marks.

Additionally, the dummy metal layer may be in the shape of crosses, rectangles, L-shaped blocks, bars, triangles or a combination of two or more thereof.

The present invention also provides a semiconductor device including:

bonded first and second wafers, the first wafer including a first substrate, a first dielectric layer on the first substrate and a first metal layer embedded in the first dielectric layer, the second wafer including a second substrate;

a patterned insulating layer on the second substrate, the patterned insulating layer having first holes and dummy holes both exposing the second substrate, the first holes located above the first metal layer;

a protective layer, which fills at least a partial depth of the dummy holes and covers side surfaces of the first holes;

TSVs, which extend through the second wafer and a partial thickness of the first dielectric layer under the first holes uncovered by the protective layer, thereby exposing the first metal layer; and a second metal layer including an interconnect metal layer, the interconnect metal layer filling the TSVs and electrically connected to the first metal layer.

Additionally, the protective layer may fill up the dummy holes, wherein the second metal layer includes only the interconnect metal layer.

Additionally, the protective layer may fill a partial depth of the dummy hole, wherein the second metal layer further includes a dummy metal layer, which resides on the protective layer so as to fill the remaining depth of the dummy holes.

The present invention also provides a bonded-chip structure including:

bonded first and second chips, the first chip including a first substrate, a first dielectric layer on the first substrate and a first metal layer embedded in the first dielectric layer, the second chip including a second substrate;

a patterned insulating layer on the second substrate, the patterned insulating layer having first holes and dummy holes both exposing the second substrate, the first holes located above the first metal layer;

a protective layer, which fills at least a partial depth of the dummy holes and covers side surfaces of the first holes;

TSVs, which extend through the second chip and a partial thickness of the first dielectric layer under the first holes uncovered by the protective layer, thereby exposing the first metal layer; and a second metal layer including an interconnect metal layer, the interconnect metal layer filling the TSVs and electrically connected to the first metal layer.

Additionally, the protective layer may fill up the dummy holes, wherein the second metal layer includes only the interconnect metal layer.

Additionally, the protective layer may fill a partial depth of the dummy hole, wherein the second metal layer further includes a dummy metal layer, which resides on the protective layer so as to fill the remaining depth of the dummy holes.

Compared with the prior art, the present invention provides the following benefits:

It provides a semiconductor device, a method of manufacturing the device and a bonded-chip structure. The method includes: providing bonded first and second wafers; forming a patterned insulating layer on the second substrate, the patterned insulating layer having first holes and dummy holes both exposing the second substrate, the first holes located above the first metal layer; forming a protective layer, which fills a partial depth of the dummy holes and covers side surfaces of the first holes; forming TSVs, which extend through the second wafer and a partial thickness of the first dielectric layer under the first holes uncovered by the protective layer, thereby exposing the first metal layer; forming a second metal layer including an interconnect metal layer and a dummy metal layer, the interconnect metal layer filling the TSVs and electrically connected to the first metal layer, the dummy metal layer filling the dummy holes. According to the present invention, the formation of the dummy metal layer is compatible with the TSV process, and the first and dummy holes are formed during the formation of the patterned insulating layer. The processes for forming the protective layer and the second metal layer merge with those for forming the dummy metal layer and the TSVs. In this way, the dummy metal layer can be formed without using any additional process or adding additional cost to enable uniform pattern density (e.g., metal density) across the surface of the second wafer and enhanced CMP uniformity, resulting in increased post-CMP flatness of the wafer surface.

BRIEF DESCRIPTION OF THE DRAWINGS

FIG. 1 is a flowchart of a method of manufacturing a semiconductor device, according to an embodiment of the present invention.

FIG. 2 schematically illustrates a semiconductor device formed after a patterned insulating layer is formed, according to an embodiment of the present invention.

In these figures:

Figures 3A, 3B, 4:
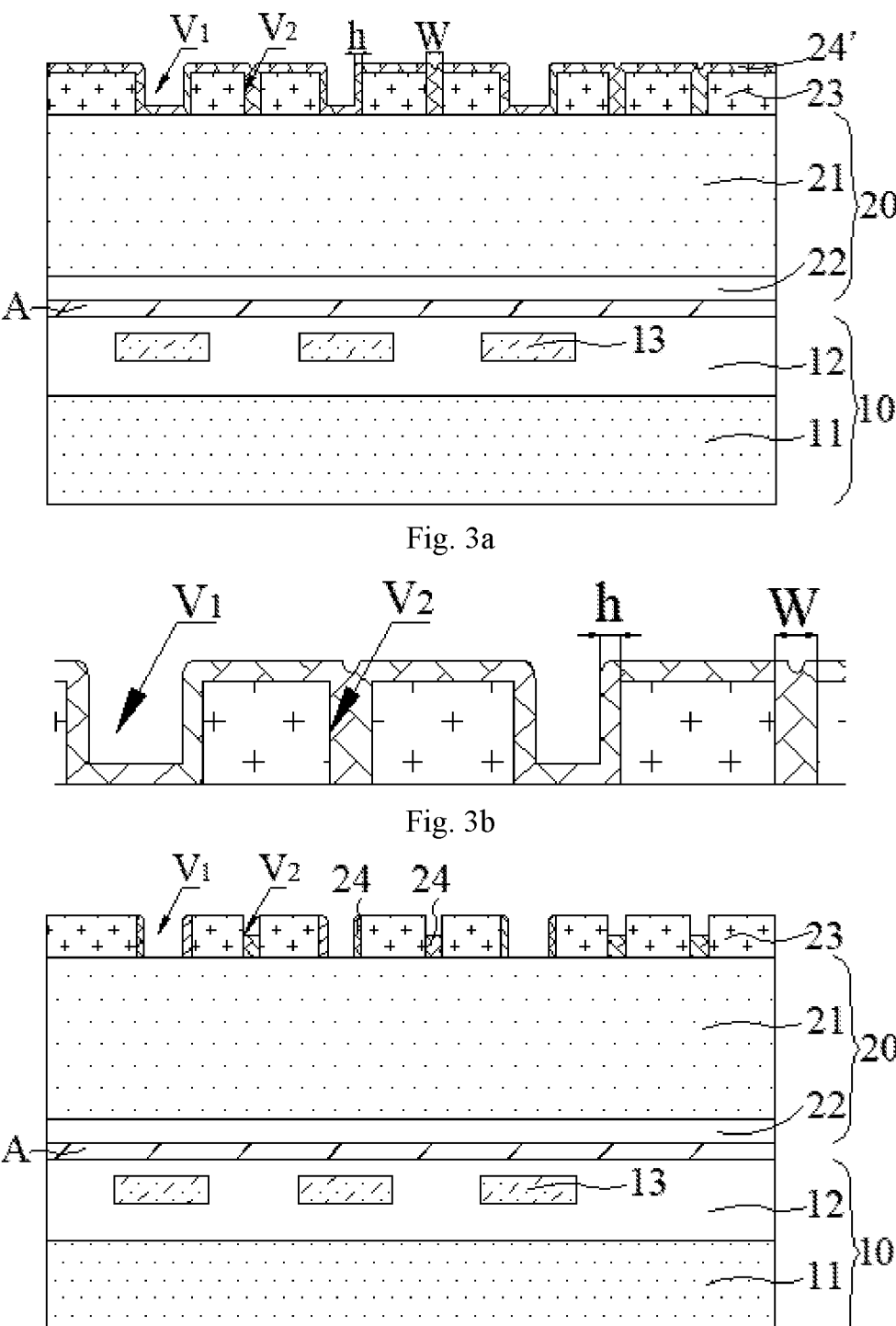
FIG. 3*a* schematically illustrates a semiconductor device formed after a protective layer is formed, according to an embodiment of the present invention.
FIG. 3*b* is an enlarged schematic view of a top portion of FIG. 3*a*.
FIG. 4 schematically illustrates a semiconductor device formed after a maskless etching process is performed, according to an embodiment of the present invention.

10—wafer; 11—first substrate; 12—first dielectric layer; 13—first metal layer; 20—wafer; 21—second substrate; 22—second dielectric layer; A—bonding layer; 23—patterned insulating layer; 24—protective layer; 24'—initial protective layer; layer; 26—second metal layer; 26*a*—interconnect metal layer; 26*b*—dummy metal layer.

DETAILED DESCRIPTION

Embodiments of the present invention provide a semiconductor device, a method of manufacturing the device and a bonded-chip structure. The present invention will be described in greater detail below with reference to the accompanying drawings and to specific embodiments. Advantages and features of the present invention will become more apparent from the following description. Note that the figures are provided in a very simplified form not necessarily drawn to exact scale and for the only purpose of facilitating easy and clear description of the embodiments.

In an embodiment of the present invention, as shown in FIG. 1, there is provided a method of manufacturing a semiconductor device, which includes:

providing bonded first and second wafers, the first wafer including a first substrate, a first dielectric layer on the first substrate and a first metal layer embedded in the first dielectric layer, the second wafer including a second substrate;

forming a patterned insulating layer on the second substrate, the patterned insulating layer having first holes and dummy holes both exposing the second substrate, the first holes located above the first metal layer;

forming a protective layer, which fills a partial depth of the dummy holes and covers side surfaces of the first holes;

forming through-silicon vias (TSVs), which extend through the second wafer and a partial thickness of the first dielectric layer under the first holes uncovered by the protective layer, thereby exposing the first metal layer;

forming a second metal layer including an interconnect metal layer and a dummy metal layer, the interconnect metal layer filling the TSVs and electrically connected to the first metal layer, the dummy metal layer filling the dummy holes; and planarizing a surface of the second wafer by performing a chemical mechanical polishing (CMP) process on the second metal layer and the patterned insulating layer.

Various steps in a method of manufacturing a semiconductor device according to an embodiment of the present invention will be described in detail below with reference to FIGS. 2 to 7*b*.

As shown in FIG. 2, bonded first 10 and second 20 wafers are provided. The first wafer 10 includes a first substrate 11, a first dielectric layer 12 on the first substrate 11 and a first metal layer 13 embedded in the first dielectric layer 12. The second wafer 20 includes a second substrate 21, a second dielectric layer 22 on the second substrate 21 and a metal layer (not shown) embedded in second dielectric layer 22. The metal layer is embedded in the second dielectric layer 22 to enable interconnection of electrical signals within the second wafer 20. It would be appreciated that, as practically needed, it is also possible to lead the electrical signals from the metal layer in the second wafer 20 to a top side of the second wafer 20 via TSVs and interconnect layers therein. The bonding is accomplished with the first dielectric layer 12 facing the second dielectric layer 22, and as a result of the bonding, these dielectric layers form a bonding layer A. The bonding layer A may be silicon nitride. In one example, a first bonding layer may be provided on the first dielectric layer 12 and a second bonding layer on the second dielectric layer 22, and the first and second bonding layers may be brought into contact and bonded to each other. The contact interface may also be called a bonding interface. In this case, the first and second bonding layers make up a bonding layer A. In another example, a bonding layer A may be provided only on either of the first dielectric layer 12 and the second dielectric layer 22. The bonding of the first wafer 10 and the second wafer 20 may be accomplished by the combination of metal-to-metal bonding and dielectric-to-dielectric bonding.

In embodiments of the present invention, both the first substrate 11 and the second substrate 21 may be semiconductor substrates made of any semiconductor materials suitable for the semiconductor device (e.g., Si, SiC, SiGe, etc.) In some other embodiment, each of the substrates may be alternatively implemented as one of various composite substrates such as Si-on-insulator (SOI) and SiGe-on-insulator (SGOI). As would be appreciated by those skilled in the art, each substrate is not limited to any particular type and may be properly selected according to the requirements of the practical applications. Various structures may be formed in the substrates (not limited to the semiconductor device being fabricated), such as gate structures.

A patterned insulating layer 23 is formed on the second substrate 21. The patterned insulating layer 23 has first holes $V_1$ and dummy holes $V_2$. Both the first holes $V_1$ and the dummy holes $V_2$ expose the second substrate, and the first holes $V_1$ are located above the first metal layer 13. The patterned insulating layer 23 may, for example, include a silicon oxide layer and/or a silicon nitride layer.

The first wafer 10 may include one or several ($\geq 2$) first metal layers 13, and the first holes $V_1$ may be aligned with the first metal layer 13 in order to enable the first metal layer 13 to be led out via TSVs. The dummy hole $V_2$ are scattered in regions of the patterned insulating layer 23 without or with sparse first holes $V_1$, resulting in a substantially uniform overall distribution of the first holes $V_1$ and the dummy hole $V_2$ in the patterned insulating layer 23. In this way, after the holes are subsequently filled with a metal or metals, a substantially uniform pattern density (metal density) can be eventually obtained across the surface of the second wafer 20. As an example, a number of spaced first holes $V_1$ may be formed in the patterned insulating layer 23, and the dummy holes $V_2$ may be formed between adjacent first holes $V_1$.

As shown in FIGS. 3*a*, 3*b* and 4, a protective layer is formed. The protective layer fills a partial depth of the dummy holes and covers side surfaces of the first holes. Specifically, as shown in FIGS. 3*a* and 3*b*, an initial protective layer 24' is deposited so as to fill up the dummy holes $V_2$ and covers side and bottom surfaces of the first holes $V_1$ and a top surface of the patterned insulating layer 23. The initial protective layer 24' may be, for example, a silicon oxide layer, a silicon nitride layer, a silicon oxynitride layer, a silicon carbide layer, a polyvinyl alcohol or organic resist film, or a combination of two or more thereof. In a cross-sectional plane perpendicular to the second substrate 21, the dummy holes $V_2$ have a cross-sectional width W. In order to ensure that the initial protective layer 24' can completely fill the dummy holes $V_2$, a critical dimension of the dummy holes, which may be, for example, their cross-sectional width W, and a thickness h of the initial protective layer 24' deposited on the side surfaces of the first holes $V_1$ should satisfy $2h \geq W$. This can ensure that the initial protective layer 24' laterally (in the direction parallel to the second substrate 21) spans the entire dummy holes $V_2$. As a result, in the subsequent etching process, the second substrate 21 under the dummy holes $V_2$ can be protected by the protective layer from possible damage.

As shown in FIG. 4, a maskless etching process is carried out to remove the initial protective layer 24' on the bottom surfaces of the first holes $V_1$ and on the top surface of the patterned insulating layer 23. At the same time, the initial protective layer 24' in the dummy holes $V_2$ loses a partial thickness, and its remainder forms the protective layer 24.

Figure 5:
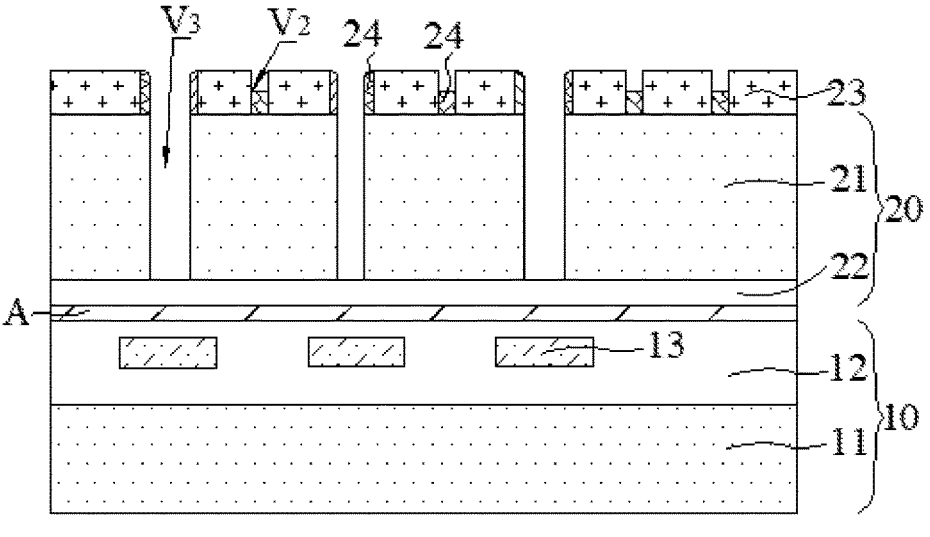
FIG. 5 schematically illustrates a semiconductor device formed after initial holes are formed, according to an embodiment of the present invention.

As shown in FIGS. 4 and 5, initial holes $V_3$ are formed, the initial holes $V_3$ extend through the second substrate 21 under the first holes $V_1$ and expose the second dielectric layer 22.

Figure 6:
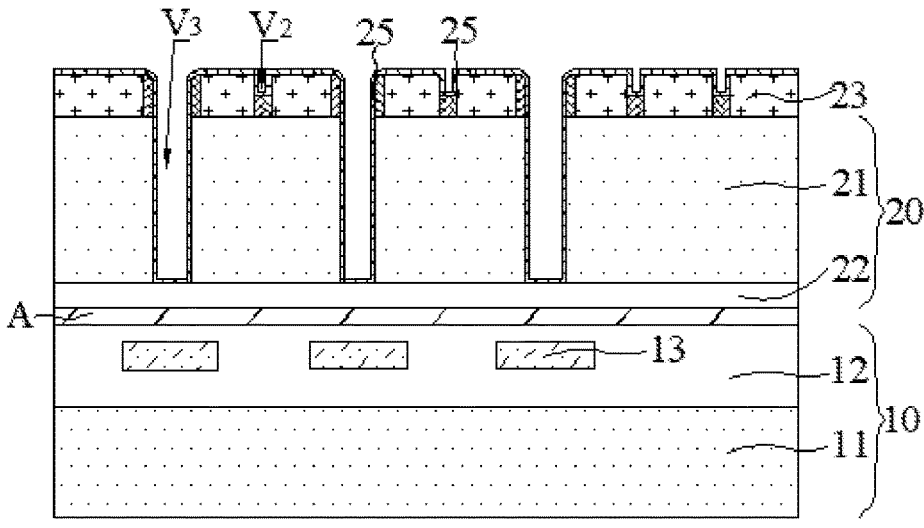
FIG. 6 schematically illustrates a semiconductor device formed after an isolation layer is formed, according to an embodiment of the present invention.

As shown in FIG. 6, an isolation layer 25 is formed, the isolation layer 25 covers side and bottom surfaces of the initial holes $V_3$ and side and bottom surfaces of the dummy holes $V_2$. The isolation layer may be in particular formed using a chemical vapor deposition process.

Figure 7:
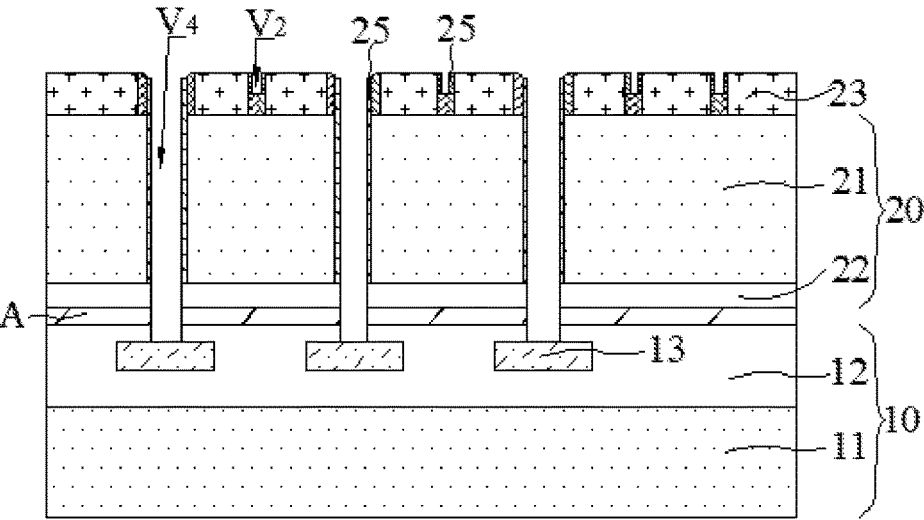
FIG. 7 schematically illustrates a semiconductor device formed after TSVs are formed, according to an embodiment of the present invention.

As shown in FIG. 7, a maskless etching process is carried out to remove the isolation layer, the second dielectric layer 22, the bonding layer A and a partial thickness of the first dielectric layer 12 under the initial holes $V_3$, thus exposing the first metal layer 13 and resulting in TSVs $V_4$. In this process, the isolation layer on the bottom surface of the dummy holes $V_2$ is etched away. The isolation layer 25 serves as a barrier preventing the material of a subsequently formed interconnect metal layer from diffuse into the second substrate 21. The isolation layer 25 may include, for example, a titanium nitride layer and/or silicon nitride layer.

Figure 8A:
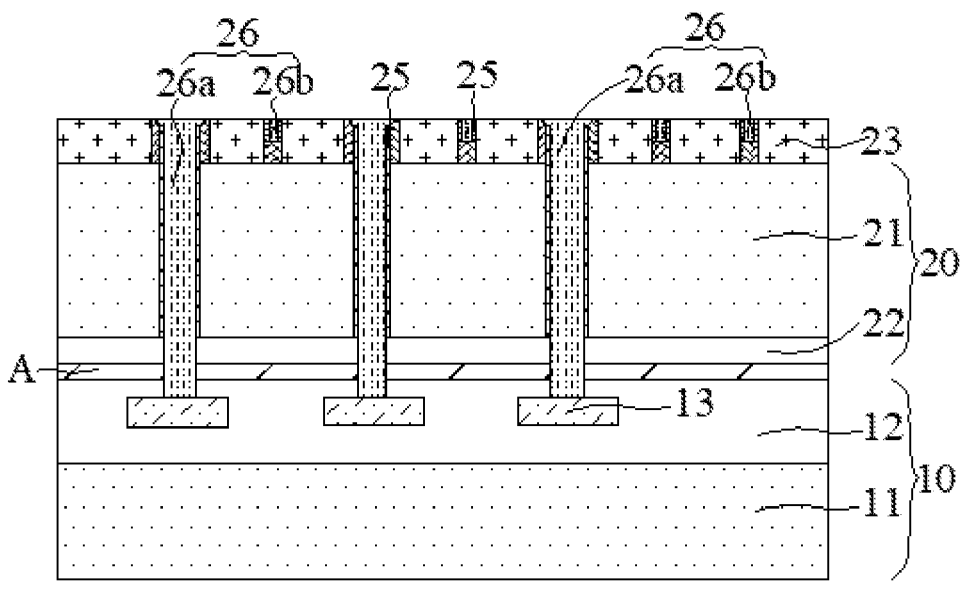
FIG. 8*a* schematically illustrates a semiconductor device with a partial thickness of a dummy metal layer remaining in dummy holes, according to an embodiment of the present invention.
Figure 8B:
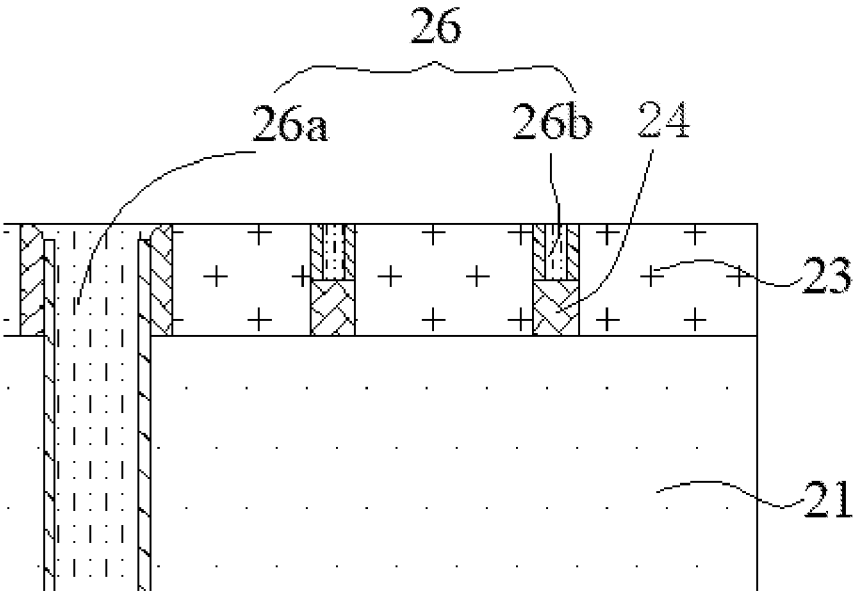
FIG. 8*b* is an enlarged schematic view of a right upper portion of FIG. 8*a*.
Figure 8C:
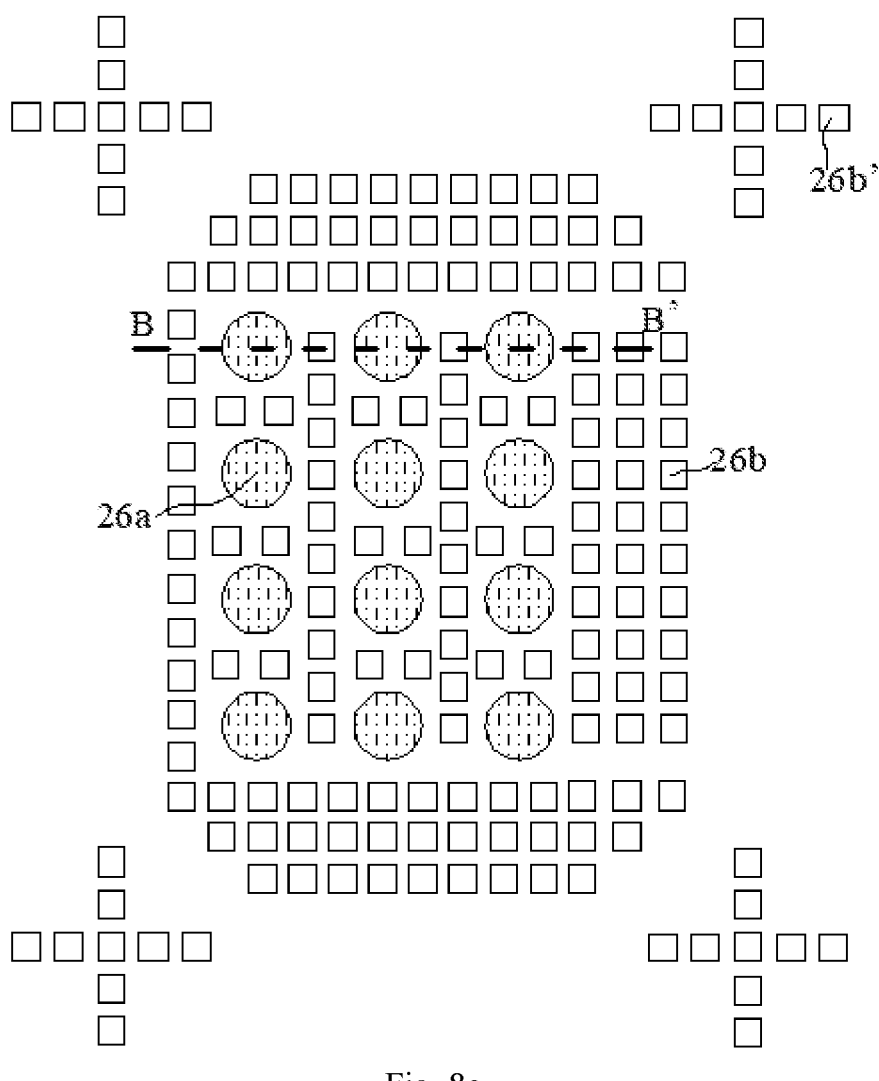
FIG. 8*c* is a schematic top view of a semiconductor device after a metal layer is formed, according to an embodiment of the present invention.

FIG. 8a schematically illustrates a semiconductor device according to an embodiment of the present invention, with a partial thickness of a dummy metal layer remaining in the dummy holes. FIG. 8b is an enlarged schematic view of a right upper portion of FIG. 8a. FIG. 8c is a schematic top view of a semiconductor device according to an embodiment of the present invention after the formation of a metal layer. FIG. 8a is a schematic cross-sectional view taken along BB' in FIG. 8c. As shown in FIGS. 8a, 8b and 8c, a second metal layer 26 is formed, the second metal layer 26 includes an interconnect metal layer 26a and a dummy metal layer 26b. The interconnect metal layer 26a fills the TSVs $V_4$ and is electrically connected to the first metal layer 13. The dummy metal layer 26b fills the dummy holes $V_2$. After that, the top side of the second wafer 20 is planarized by chemical mechanical polishing (CMP). The second metal layer 26 may be copper, for example. The interconnect metal layer 26a may be formed by electroplating.

Figure 9A:
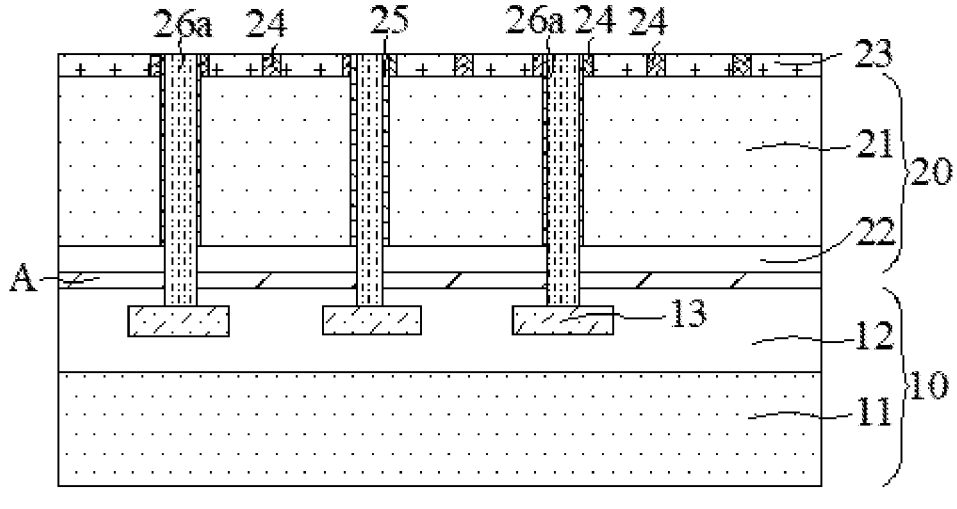
FIG. 9*a* schematically illustrates a semiconductor device, in which a dummy metal layer in dummy holes is completely removed by CMP, according to an embodiment of the present invention.
Figure 9B:
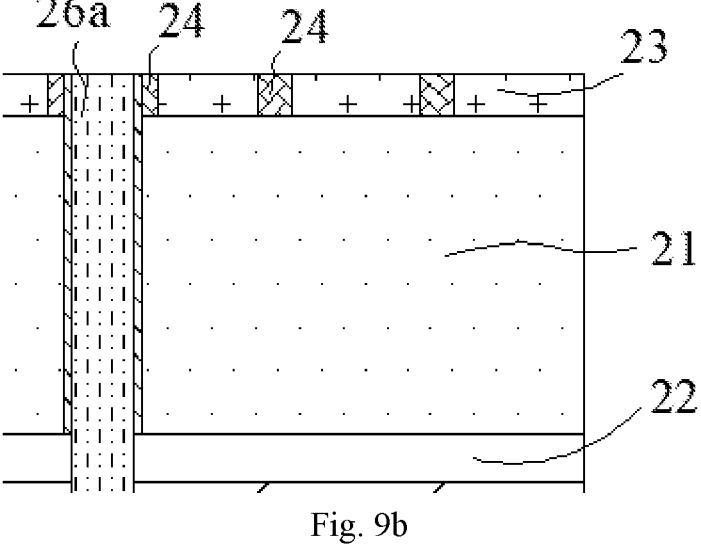
FIG. 9*b* is an enlarged schematic view of a right upper portion of FIG. 9*a*.

A partial thickness of the dummy metal layer 26b may remain in the dummy holes $V_2$ from the CMP process, as shown in FIGS. 8a and 8b, by controlling a period of time that this process lasts for. Alternatively, the entire thickness of the dummy metal layer 26b in the dummy holes $V_2$ may be directly removed by polishing, as shown in FIGS. 9a and 9b. One of the options may be selected as practically required, both of which can achieve improved CMP uniformity by virtue of uniform pattern density (e.g., metal density) across the top side of the second wafer 20 resulting from the presence of the dummy metal layer 26b.

The dummy metal layer 26b may also provide alignment marks (e.g., 26b' in the figure). The dummy metal layer 26b may be designed to define a particular alignment pattern, the dummy metal layer 26b may have the shape of, for example, crosses (e.g., 26b' in the figure), rectangles, L-shaped blocks, bars, triangles or a combination of two or more thereof. This alignment pattern may help in overlying pattern alignment in the subsequent processes such as post-CMP thickness measurement and defect scanning of the TSVs.

According to embodiments of the present invention, the dummy metal layer 26b is formed in the patterned insulating layer 23 overlying the second substrate 21. It has been found from research that, if the dummy metal layer is formed in multiple openings in the substrate, additional stress and defects may be introduced to the substrate. In order to avoid such stress and defects that may be introduced to the second substrate 21, according to embodiments of the present invention, the dummy metal layer 26b is formed in the dummy holes $V_2$ in the patterned insulating layer 23.

According to embodiments of the present invention, the formation of the dummy metal layer 26b occurs during the formation, filling and polishing of the TSVs $V_4$, without using any additional process or adding additional cost. Therefore, it can result in uniform pattern density (e.g., metal density) across the surface of the second wafer 20 and hence increased post-CMP flatness of the wafer surface while being compatible with the through-silicon via (TSV) process. The dummy metal layer 26b can also provide alignment marks, which define an alignment pattern for use in the subsequent processes.

As shown in FIGS. 8a, 8b, 8c, 9a and 9b, the present invention also provides a semiconductor device including:

bonded first 10 and second 20 wafers, the first wafer including a first substrate 11, a first dielectric layer 12 on the first substrate and a first metal layer 13 embedded in the first dielectric layer, the second wafer including a second substrate 21;

a patterned insulating layer 23 on the second substrate, the patterned insulating layer having first holes $V_1$ and dummy holes $V_2$ both exposing the second substrate 21, the first holes $V_1$ located above the first metal layer 13;

a protective layer 24, which fills at least a partial depth of the dummy holes and covers side surfaces of the first holes;

through-silicon vias (TSVs) $V_4$, which extend through the second wafer and a partial thickness of the first dielectric layer under the first holes uncovered by the protective layer, thereby exposing the first metal layer 13; and a second metal layer 26 including at least an interconnect metal layer 26a, the interconnect metal layer filling the TSVs and electrically connected to the first metal layer.

In the above-discussed method, since a partial thickness of the dummy metal layer 26b may remain in the dummy holes $V_2$ from the CMP process by controlling a period of time this process lasts for. Alternatively, the entire thickness of the dummy metal layer 26b in the dummy holes $V_2$ may be directly removed in the CMP process. One of the options may be selected as practically required, both of which can achieve improved CMP uniformity by virtue of uniform pattern density (e.g., metal density) across the top side of the second wafer 20 resulting from the presence of the dummy metal layer 26b.

Accordingly, the resulting semiconductor structure may assume either of the following possible configurations. In the first configuration, as shown in FIGS. 8a and 8b, the protective layer 24 fills a partial depth of the dummy holes, and the second metal layer 26 further includes the dummy metal layer 26b, the dummy metal layer 26b resides on the protective layer 24 so as to fill the remaining depth of the dummy holes. In the second configuration, as shown in FIGS. 9a and 9b, the protective layer 24 fills up the dummy holes, and the second metal layer includes only the interconnect metal layer 26a.

Compared with the design in which the dummy holes are entirely filled with a metal layer, the protective layer 24 filled in the dummy holes $V_2$ according to this application can mitigate the influence of wafer deformation, helping to improve the yield of the semiconductor device. In some specific applications, such as those in back-illuminated image sensors, the presence of any metal material in the dummy holes is desired to be avoided because it may adversely affect the device's light absorption properties. In this case, the dummy holes may be filled with only the protective layer.

The present invention also provides a bonded-chip structure, including:

bonded first and second chips, the first chip including a first substrate, a first dielectric layer on the first substrate and a first metal layer embedded in the first dielectric layer, the second chip including a second substrate;

a patterned insulating layer on the second substrate, the patterned insulating layer having first holes and dummy holes both exposing the second substrate, the first holes located above the first metal layer;

a protective layer, which fills at least a partial depth of the dummy holes and covers side surfaces of the first holes;

through-silicon vias (TSVs), which extend through the second chip and a partial thickness of the first dielectric layer under the first holes uncovered by the protective layer, thereby exposing the first metal layer; and a second metal layer including at least an interconnect metal layer, the interconnect metal layer filling the TSVs and electrically connected to the first metal layer.

Additionally, the protective layer may fill up the dummy holes, and the second metal layer may include only the interconnect metal layer.

Additionally, the protective layer may fill a partial depth of the dummy hole, and the second metal layer may further include a dummy metal layer, which resides on the protective layer so as to fill the remaining depth of the dummy holes.

The bonded-chip structure of the present invention may be obtained by dicing the above-discussed semiconductor device. FIGS. 8*a*, 8*b*, 9*a* and 9*b* are schematic illustrations of exemplary configurations of the bonded-chip structure.

In summary, the present invention provides a semiconductor device, a method of manufacturing the device and a bonded-chip structure. The method includes: providing bonded first and second wafers; forming a patterned insulating layer on the second substrate, the patterned insulating layer having first holes and dummy holes both exposing the second substrate; forming a protective layer, which fills a partial depth of the dummy holes and covers side surfaces of the first holes; forming through-silicon vias (TSVs); forming a second metal layer including an interconnect metal layer and a dummy metal layer, the interconnect metal layer filling the TSVs and electrically connected to the first metal layer, the dummy metal layer filling the dummy holes. According to the present invention, the formation of the dummy metal layer is integrated with the TSV process and is therefore done without using any additional process or adding additional cost to enable uniform pattern density (e.g., metal density) across the surface of the second wafer and enhanced CMP uniformity, resulting in increased post-CMP flatness of the wafer surface.

The embodiments disclosed herein are described in a progressive manner with the description of each embodiment focusing on its differences from others, and reference can be made between the embodiments for their identical or similar parts. Since the method embodiments correspond to the device embodiments, they are described relatively briefly, and reference can be made to the device embodiments for details in the method embodiments.

The foregoing description presents merely preferred embodiments of the present invention and is not intended to limit the scope of the present invention in any way. Any and all changes and modifications made by those of ordinary skill in the art in light of the above teachings without departing from the spirit of the present invention are intended to be embraced in the scope as defined by the appended claims.

What is claimed is:

1. A method of manufacturing a semiconductor device, comprising:

providing a bonded structure, the bonded structure comprising a substrate;

forming a patterned insulating layer on the substrate, the patterned insulating layer having first holes and dummy holes both exposing the substrate;

forming a protective layer, which fills at least a partial depth of the dummy holes and covers side surfaces of the first holes;

forming through-silicon vias (TSVs), which extend through the substrate under the first holes uncovered by the protective layer, thereby exposing a first metal layer defined in the bonded structure;

forming a second metal layer comprising an interconnect metal layer and a dummy metal layer, the interconnect metal layer filling the TSVs and electrically connected to the first metal layer, the dummy metal layer filling the dummy holes; and planarizing a surface of the bonded structure by performing a chemical mechanical polishing (CMP) process on the second metal layer and the patterned insulating layer.

2. The method of manufacturing a semiconductor device of claim 1, wherein the dummy holes are scattered in regions of the patterned insulating layer without or with sparse first holes, resulting in a uniform overall distribution of the first holes and the dummy holes in the patterned insulating layer.

3. The method of manufacturing a semiconductor device of claim 2, wherein a plurality of first holes are spaced apart in the patterned insulating layer, the dummy holes being scattered between adjacent first holes.

4. The method of manufacturing a semiconductor device of claim 1, wherein the formation of the protective layer comprises:

depositing an initial protective layer, which fills the dummy holes and covers side and bottom surfaces of the first holes and a top surface of the patterned insulating layer; and removing the initial protective layer on the bottom surfaces of the first holes and on the patterned insulating layer and a partial thickness of the initial protective layer in the dummy holes by maskless etching, the remainder of the initial protective layer forming the protective layer.

5. The method of manufacturing a semiconductor device of claim 4, a cross-sectional width W of the dummy holes in a cross-sectional plane perpendicular to the substrate and a thickness h of the initial protective layer deposited on the side surfaces of the first holes satisfies 2h>W, making the initial protective layer span the dummy holes in a direction parallel to the substrate.

6. The method of manufacturing a semiconductor device of claim 1, wherein the bonded structure comprises bonded first and second wafers, the first wafer comprising a first substrate, a first dielectric layer on the first substrate and the first metal layer embedded in the first dielectric layer, the second wafer comprising a second substrate; the patterned insulating layer formed on the second substrate, the first holes and the dummy holes both exposing the second substrate, the TSVs extending through the second wafer and a partial thickness of the first dielectric layer, the surface of the second wafer of the bonded structure being planarized by the CMP process.

7. The method of manufacturing a semiconductor device of claim 1, wherein, in the step of performing the CMP process on the second metal layer and the patterned insulating layer, a partial thickness of the dummy metal layer or an entirety thickness of the dummy metal layer is removed by the CMP process.

8. The method of manufacturing a semiconductor device of claim 1, wherein the dummy metal layer serves as alignment marks.

9. The method of manufacturing a semiconductor device of claim 8, wherein the dummy metal layer has a shape of crosses, rectangles, L-shaped blocks, bars, triangles or a combination of two or more thereof.

10. The method of manufacturing a semiconductor device of claim 6, wherein the formation of the TSVs comprises:

forming initial holes, which extend through the second substrate under the first holes;

forming an isolation layer, which covers side and bottom surfaces of the initial holes and side and bottom surfaces of the dummy holes; and etching the isolation layer, the second dielectric layer in the second wafer and a partial thickness of the first dielectric layer under the initial holes until the first metal layer is exposed, thereby forming the TSVs.

* * * * *